(12) United States Patent
Joseph et al.

(10) Patent No.: US 7,635,844 B2
(45) Date of Patent: Dec. 22, 2009

(54) MICROSYSTEM MANIPULATION APPARATUS

(75) Inventors: Brian E. Joseph, Wheeling, WV (US); Elizabeth N. Kraftician, Wheeling, WV (US); Thomas M. Matviya, McKees Rocks, PA (US)

(73) Assignee: Touchstone Research Laboratory, Ltd., Triadelphia, WV (US)

( * ) Notice: Subject to any disclaimer, the term of this patent is extended or adjusted under 35 U.S.C. 154(b) by 287 days.

(21) Appl. No.: 11/424,565

(22) Filed: Jun. 16, 2006

(65) Prior Publication Data

US 2007/0045537 A1    Mar. 1, 2007

Related U.S. Application Data

(60) Provisional application No. 60/595,228, filed on Jun. 16, 2005.

(51) Int. Cl.
    *G21K 7/00*    (2006.01)
(52) U.S. Cl. .................. 250/310; 250/442.11; 250/306; 250/311

(58) Field of Classification Search .................. 250/310; 310/323.01
See application file for complete search history.

(56) References Cited

U.S. PATENT DOCUMENTS

| | | | |
|---|---|---|---|
| 7,196,454 B2* | 3/2007 | Baur et al. | 310/323.01 |
| 2003/0089852 A1* | 5/2003 | Ochiai et al. | 250/310 |
| 2005/0199828 A1* | 9/2005 | Tokuda et al. | 250/492.3 |
| 2006/0163478 A1* | 7/2006 | Jaksch et al. | 250/310 |

* cited by examiner

*Primary Examiner*—Nikita Wells
*Assistant Examiner*—Johnnie L Smith
(74) *Attorney, Agent, or Firm*—Philip D. Lane

(57) ABSTRACT

A microsystem manipulation apparatus and an associated kit is described that may be used to facilitate the assembly and testing of Microsystems and microsystem components. The microsystem manipulation apparatus may include a scanning electron microscope imaging system, a stage, and at least one manipulator having an associated tool. The microsystem manipulation apparatus may be partially or fully automated to provide for routine microsystem assembly, disassembly, and/or testing. The associated kit may include one or more manipulators and associated tools for retrofitting an existing scanning electron microscope to produce a microsystem manipulation apparatus.

16 Claims, 3 Drawing Sheets

MICROSYSTEM MANIPULATION APPARATUS

CROSS-REFERENCE TO RELATED APPLICATIONS

The present application claims priority to U.S. Provisional Patent Application No. 60/595,228, filed on Jun. 16, 2005, herein specifically incorporated by reference in its entirety.

BRIEF SUMMARY OF THE INVENTION

The present invention relates to an apparatus for the assembly and/or testing of microsystems or component thereof. In certain embodiments, a microsystem manipulation apparatus may include a scanning electron microscope, an operating chamber within which the scanning electron microscope operates, a first manipulator having an end within the operating chamber, a second manipulator having an end within the operating chamber, and a stage movable by a third manipulator and positioned within said operating chamber and near said first manipulator.

In other embodiments, a microsystem manipulation apparatus may include a scanning electron microscope, an operating chamber within which the scanning electron microscope operates, at least one manipulator having an end within the operating chamber, and a stage positioned within the operating chamber and near said manipulator, where the sum of the degrees of freedom of the at least one manipulator and the stage is at least two and is not 6 and is not 8.

In certain embodiments, a microsystem manipulation apparatus may include a scanning electron microscope, an operating chamber within which the scanning electron microscope operates, at least one manipulator having an end within the operating chamber, and a stage positioned within the operating chamber and near the at least one manipulator, wherein the sum of the degrees of freedom of the at least one manipulator and the stage may range from one to five.

Still further, the invention may include a microsystem manipulation kit. The kit may include a manipulator having an end, wherein the manipulator is adapted to be mounted to an operating chamber of a scanning electron microscope, and at least one tool, where the tool is adapted to be mounted on the end of the manipulator.

DETAILED DESCRIPTION OF CERTAIN EMBODIMENTS OF THE INVENTION

Microsystems are small systems or devices having components or parts on the order of about 0.25 microns to about 1,000 microns. Many microsystems may have components ranging from about 1 to about 700 microns. Microsystems may include, but are not limited to, micromechanical systems, microelectromechanical systems, and microelectronic systems, or components thereof. Microsystems may be designed for any of a variety of purposes. These purposes have included accelerometers, sensors, optical switches, projection and handheld displays, miniature read/write heads; cell phone parts, radar applications, and microrelays.

Assembly and testing of Microsystems are problematic due to the small operating scale. Much of this difficulty relates to the optical imaging methods commonly used to observe small microsystem parts during assembly and testing. Optical imaging methods typically lack sufficient resolution and depth of field to make clear observation and accurate placement of very small parts practical.

The scanning electron microscope provides a resolution and depth of field of about 100 times greater than most visible light imaging systems. The present invention is directed to incorporating a scanning electron microscope with various manipulators, stages, tools, and detectors, in various combinations and configurations in an apparatus for the assembly and/or testing of Microsystems or component thereof.

Figure 1:
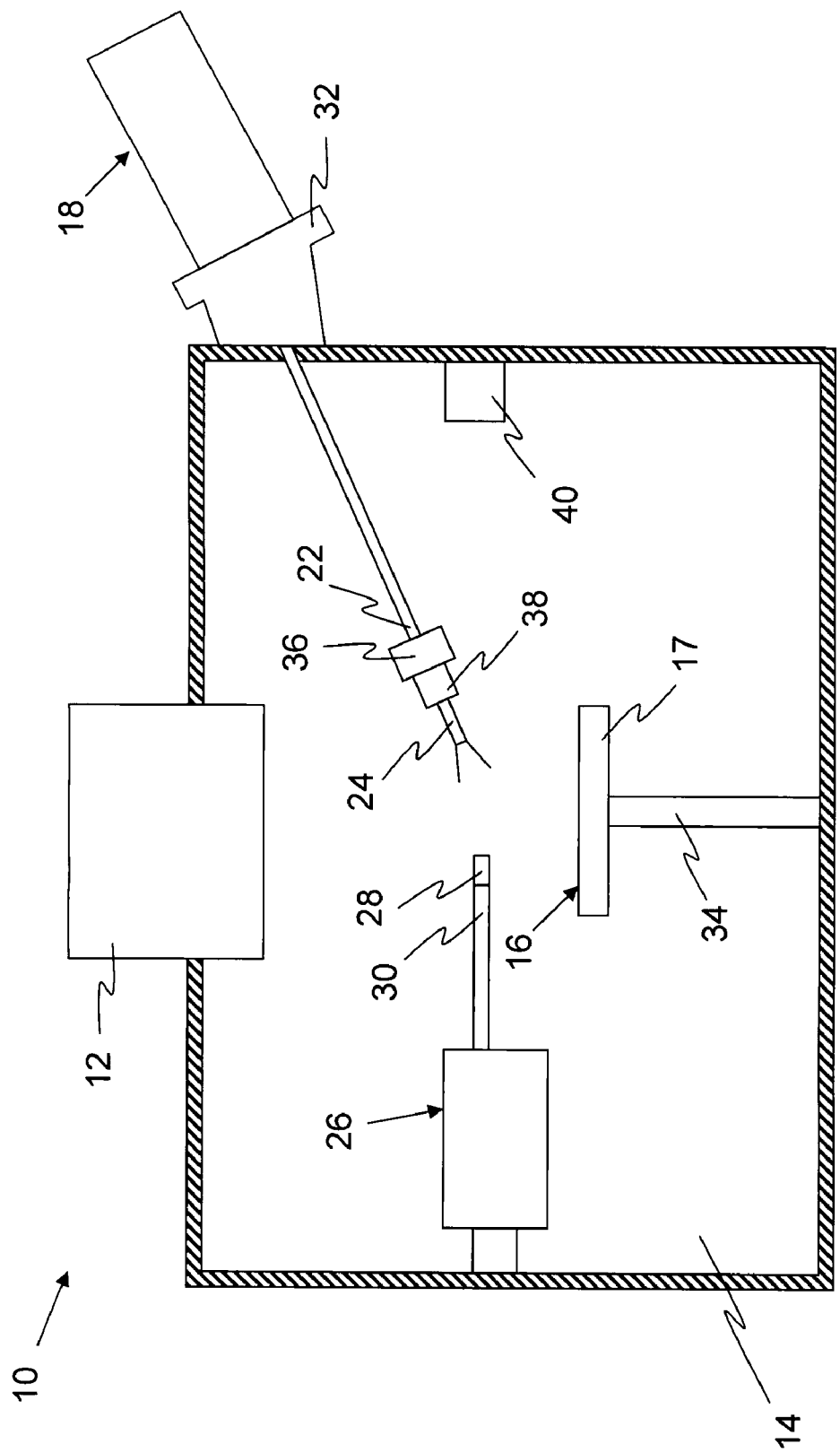
FIG. 1 illustrates a microsystem manipulation apparatus in accordance with an embodiment of the invention.

With reference now to FIG. 1, there is illustrated an embodiment of a microsystem manipulation apparatus 10. The microsystem manipulation apparatus 10 may include a scanning electron microscope 12 and an operating chamber 14. The scanning electron microscope 12 operates within the operating chamber 14. The scanning electron microscope 12 is used to image the microsystem device, or components thereof, during assembly, disassembly, or testing thereof. In certain embodiments, the scanning electron microscope 12 may include, but is not limited to, a conventional scanning electron microscope, a microprobe, a scanning/transmission scanning electron microscope, a field emission scanning electron microscope, or an environmental scanning electron microscope. By utilization of a scanning electron microscope, resolutions and depths of fields typically about 100 times greater than those of currently used optical instruments are obtainable. In certain embodiments the microsystem manipulation apparatus 10 provides for the assembly and/or testing of Microsystems, or components thereof, within the field of view of a scanning electron microscope. The apparatus 10 may be configured for one or more of testing, assembly, or disassembly of microsystems, or components thereof. This device may also be used to construct other microsystem assembly and/or testing devices.

The scanning electron microscope 12 operates within an operating chamber 14. The operating chamber 14 may be a vacuum chamber such as that for a conventional scanning electron microscope which typically operates under high vacuums of less than about $10^{-3}$ torr and more typically less than about $10^{-5}$ torr. Alternatively, when an environmental scanning electron microscope is used as the scanning electron microscope, the operating chamber 14 may operated in medium vacuums of typically less than or equal to about 20 torr. The ability to operate in medium vacuums as provided by an environmental scanning electron microscope may be advantageous. For example, environmental scanning electron microscopes provide for the ready imaging of nonconductive materials. Those scanning electron microscopes requiring a high vacuum for imaging will generally always have incorporated a high vacuum chamber in which the sample is imaged. Environmental scanning electron microscopes do not necessarily have an incorporated high vacuum chamber but will image the sample in an incorporated vacuum chamber designed to minimally provide for medium vacuums. Such chambers also serve to prevent operator exposure to the particulate and electromagnetic radiation inherent to the imaging process. In either case, most scanning electron microscope imaging systems will have an incorporated chamber in which the sample is imaged. The incorporated chamber may be used as the operating chamber 14. The operating chamber 14 may be the chamber supplied by scanning electron microscope manufacturer, or may be specially configured to accommodate specific stages, manipulators, and/or microsystem containing samples or devices, and the like.

With continuing reference to FIG. 1, the microsystem manipulation apparatus 10 may include a stage 16. The stage 16 is positioned within the operating chamber 14 and positions the microsystem, or components of the microsystem, within the field of view of the scanning electron microscope 12. The stage is a location or surface on an object or device where a microsystem, or a component thereof, is localized and acted upon by one or more manipulators 18 for the purpose of assembly, disassembly, and/or testing within the field of view of the scanning electron microscope 12. For example, the stage 16 may be a location or a surface on an object or device. The object or device incorporating the stage 16 may be mounted directly or indirectly to the operating chamber 14. The device incorporating the stage may also provide for movement of the stage. If such movement of the stage is provided for, the device incorporating the stage may be considered a manipulator, or more specifically a stage manipulator. Minimally a portion of the stage is visible in the field of view of the scanning electron microscope. In some embodiments, the stage 16 is movable and has five degrees of freedom (x, y, z axis linear motions, rotation, and tilt) by action of the stage manipulator. Prototype and experimental microsystem assembly, disassembly, and testing are enhanced by stage mobility on and around multiple axes. Production assembly and testing of microsystem devices may potentially be performed using stages having provision for motion on a limited number, or even zero, degrees of freedom. In some embodiments, the stage 16 may be provided by a surface or location on an object or device rigidly mounted in the field of view of the scanning electron microscope 12. Provision for moving the stage 16 on any of the available degrees of freedom may be provided by operator manipulation of stage manipulator movement controls located outside of the sample chamber. Manipulation of these controls causes movement of the stage manipulator and thus the stage, by mechanical, electrical, and/or electronic means. Such manipulation may be by direct operator interaction, or may be by indirect operator interaction such as provided by the programming and/or design of various types of automated control devices. Suitable automated control devices include various types of analog or digital, hard-wired or programmable, controllers. The functionality of such controllers can be achieved through mechanical, electromechanical, and/or electronic means and can include electronic/digital optical recognition and robotic methods. Suitable controllers can include computers, other electronic devices, mechanical devices, and combinations thereof.

In some embodiments, the stage 16 may include a surface of a scanning electron microscope stage 17. The scanning electron microscope stage is solidly mounted on a device, commonly referred to as a scanning electron microscope stage platform 34, which provides for movement of the scanning electron microscope stage. As such, the scanning electron microscope stage and stage platform may constitute a manipulator and more specifically, a stage manipulator. The stage platform 34 is connected to controls located outside of the operating chamber 14. Operator manipulation of these controls causes the stage platform, and thus the stage 16 to move. By adjustment of the associated controls, the operator may position the stage 16, and any microsystems or component parts thereon, within the viewing area of the scanning electron microscope 12.

The utility of the stage 16 can be enhanced by the incorporation of various devices on or to the stage. For example, in some embodiments, the stage 16 may be a surface of, or a location on, an assembly stage such as that described in U.S. Pat. No. 6,590,212, herein specifically incorporated by reference in its entirety. The assembly stage provides a surface upon which the microsystem and/or component parts may be positioned for assembly, disassembly, and/or testing. Such an assembly stage is fabricated so that assembly and/or testing of the microsystem and/or component parts may be facilitated. For example, a raised area or "lip" may be incorporated around the perimeter of the surface of the assembly stage to localize microsystems or associated parts. Raised areas or depressions may be incorporated into the surface of the assembly stage to aid in the positioning of microsystems or component parts thereof. Also, holders may be located around the periphery, or in, the assembly stage. Such holders may include apertures or other containment devices such as apertures for placement of parts and/or other materials necessary or useful for the fabrication and/or testing of the microsystem devices. The placement of parts, tools, adhesives, and/or other materials within these containment devices allows for ready accessibility thereto during assembly, disassembly, and/or testing operations.

Another device that may enhance the utility of the stage is a hot stage heater. This hot stage heater may be fabricated and/or installed such that it has a surface that may be used as the stage. For example, such a hot stage heater may lie on top of an existing scanning electron microscope stage, or lie between an existing scanning electron microscope stage and an assembly stage. The use of such a hot stage heater, and its associated temperature control devices, permits careful and accurate control of the temperature of the stage upon which assembly, disassembly, and/or testing of the microsystem and/or component parts occurs. Additionally, the hot stage heater may provide for heating of parts being assembled, for example, to cure thermosetting polymers or to braze or solder parts. Elevated temperature testing of parts, materials, and/or assemblies or "burn in" temperature operating conditions of electronic or mechanical assemblies can also be accomplished by use of a hot stage heater. The use of a hot stage heater in combination with an assembly stage having holders may lead to undesired heating of parts and materials within those holders. If such holders are located on the periphery of the assembly stage, provision can be made to provide some form of insulation, such as a gap, ceramic insulating material, or the like, between the stage and the holder. Similar to the hot stage heater, a cryogenic stage cooler may be installed to provide for low temperature testing and/or assembly of microsystem devices or component parts thereof.

With reference to FIG. 1, the microsystem manipulation apparatus 10 may include a manipulator 18 having an end 22 within the operating chamber 14. The manipulator 18 may include a tool 24 positioned at the end 22 such that the working portion of the tool is located, or may be located, within the field of view of the scanning electron microscope 12 and can also contact the microsystem, or components that may be localized on a stage 16. The working portion of a tool is that portion of the tool that contacts or otherwise interacts with the microsystem or component. In certain embodiments, the working portion of the tool is located, or can be located, within the field of view of the scanning electron microscope such that the stage 16 may also be contacted.

The manipulator 18 provides for physical interaction between the operator and the microsystem, or components thereof, located on the stage 16. The interaction provided by the manipulator can include, but is not limited to, moving, assembly, disassembly, fabrication, testing, and the like, of microsystems or components thereof. More than one manipulator may be incorporated into the assembly and test device. As illustrated in FIG. 1, a second manipulator 26 having a tool 28 positioned on an end 30 of the second manipulator may be provided. The manipulator 18 may be mounted to the operating chamber 14 such that at least the end 22 of the manipulator is located with the operating chamber 14. Alternatively, the manipulator may be located within the operating chamber 14.

The tools 24 and 28 may be stationary or capable of movement on one or more axis. If movable, the tool, in certain embodiments, has a displacement resolution less than that minimum resolution required for performing the required operation. In some embodiments, the tool may have a displacement resolution of, or less than, about 0.1 microns. Lower resolution values are preferred. Lacking such a displacement resolution, or if stationary, the tool must be positioned within the field of view of the scanning electron microscope such that movement of the stage 16, by action of the stage manipulator, or another manipulator, can position the micorsystem, or component parts thereof, to provide contact with the tool. If movable for this purpose, the stage 16 may have a displacement resolution less than that minimum resolution required for performing a required operation. In certain embodiments, the stage 16 may have displacement resolution of, or less than, about 0.1 microns. In some embodiments, the tool may have provision for movement on more than one axis. In other embodiments, the tool may have provision for movement on three or more axis. Movement of the tool can be provided by movement of the entire manipulator, a portion of the manipulator, and/or only the tool.

The size of the working portion of the tool should be compatible with that of the microsystem and associated components acted upon by the tool. Tools may include, but are not limited to, grippers, microgrippers, indentors, microindentors, nanoindentors, a stage, knifes, scrappers, hooks, chisels, punches, heating irons, welding electrodes, adhesive dispensers, and other joining or material shaping, cutting, and removal tools. Tools may also include test probes, including, but not limited to, those probes used for linear measurement, temperature measurement, voltage or amperage measurements, hardness testing, and force measurements of various types. Tools can be mounted and/or used in combination. For example, grippers can be used to hold and position an adhesive dispenser. Also, combinations of various tools can be simultaneously mounted one or more manipulators, if desired. For example, dual test probes can be used to measure the voltage difference between two contact points on a microsystem device. Tools can also be used to position a microsystem, or component parts thereof, for joining or attachment to form larger and/or more complex assemblies. Where necessary, attachment of the various parts being assembled can be achieved in a variety of ways, for example, by friction fit, through the use of thermosetting or thermoplastic polymers cured by heat, elapsed time, electron beam, or UV light, laser light, or by soldering or brazing.

Provision for operating and/or moving the tool on any of the available degrees of freedom may be provided by operator manipulation of tool manipulator controls located outside of the sample chamber. Manipulation of these controls causes movement of the manipulator, and thus the tool, by mechanical, electrical, and/or electronic means. As with the stage manipulator, the manipulation of these controls may be by direct operator interaction, or may be by indirect operator interaction such as provided by various types of automated control. Suitable automated control devices include various types of analog or digital, hard-wired or programmable, controllers. The functionality of such controllers can be achieved through mechanical, electromechanical, and/or electronic means and can include electronic/digital optical recognition and robotic methods. Suitable controllers can include computers, other electronic devices, mechanical devices, and combinations thereof such as are known in the associated arts.

In embodiments where the microsystem manipulation apparatus only includes a stage manipulator and a manipulator comprising a tool, the sum of the number of degrees of freedom of the stage manipulator and the manipulator comprising the tool is greater than or equal to 2, and is not 6 or 8. Larger values of this sum, for example 7, 9, or more, provide additional flexiblity in their applicability and are capable of readily performing non-routine microsystem assembly, disassembly, or testing. Devices having lower values of this sum have more utility for routine, or mass, testing and/or production where simple or repetitive movements may be used. A device having a sum of degrees of freedom of about 2 may be generally suitable only for very routine, or mass production and/or testing of a very specific Microsystems or component parts thereof.

In embodiments where the microsystem manipulation apparatus includes three or more manipulators, there is no limitation on the sum of the number of degrees of freedom exhibited by the manipulators.

The tools 24 and 28 are located within the operating chamber 14. The other components which comprise the manipulator 18 or 26 may be positioned totally or partially inside the sample chamber. The manipulator 18 or 26 may be mounted to the operating chamber walls, floor, or the like. The manipulator 18 or 26 may also be mounted on the stage, any stage supporting structures, and other manipulators, or any other area of the sample chamber. For example, most scanning electron microscope sample chambers are equipped with a variety of ports. These ports provide a convenient location for installation and mounting of a manipulator by use of appropriate adapters. Such ports are especially convenient for the installation and mounting of manipulators having a dimension larger than can be accommodated within the scanning electron microscope sample chamber. Regardless of the location to which the manipulator is mounted, it may be advantageous to use an adapter to secure the manipulator to the mounting location. Such an adapter, which may be referred to as an alignment guide 32, positions the manipulator such that its incorporated tool is in the field of view of the scanning electron microscope and may contact any Microsystems or components thereof located upon the stage. The alignment guide may also provide of movement of the manipulator. Regardless of the method and position selected for mounting of the manipulator, any manipulator movement controls must be located outside of the sample chamber and be directly or indirectly accessible to the operator.

In some embodiments, a manipulator may comprise a scanning electron microscope stage platform. Provisions may be made for mounting one or more tools on the scanning electron microscope stage platform to provide for physical interaction between the operator and the microsystem or components thereof located on a stage.

In certain embodiments, the manipulator 18 or 26 may comprise a high precision linear motion feedthrough device. Such devices are especially useful if equipped with a motorized feed incorporating a high resolution stepping motor and suitable controller. For example, a high precision linear motion feedthrough device having a shaft pitch of 0.125 inches per revolution coupled with a stepping motor having a resolution of 51200 steps per revolution provides for a linear shaft movement having a theoretical motion resolution of 64 nanometers. Suitable high precision linear motion feedthrough devices and stepper motors are available commercially from such companies as Huntington Mechanical Laboratories, Inc. (1040 La Avenida Street, Mountain View, Calif. 94043-1483) and Kurt J. Lesker Company (1515 Worthington Ave., Clairton, Pa. 15025). Equipping the operative end of such motorized feedthrough devices with a tool results in a manipulator having at least one degree of freedom. An especially useful tool for attachment to a motorized feedthrough device is a microgripper such as a model MG-1000 Microgripper produced by Preiser Scientific (94 Oliver Street, PO Box 1330, St. Albans, W.V. 25177). Other manipulators may be envisioned that incorporate various types of movable joints that provide for coarse or fine adjustment of tool or probe position with respect to the stage 16. Movement of such joints may be by manual or automated control. Furthermore, the device may be partially or fully automated to provide for routine microsystem assembly and/or testing.

A variety of auxiliary devices that support microsystem assembly and testing may also be included to enhance the capabilities thereof. In some embodiments, high resolution piezoelectric positioning devices may be used to move a manipulator, a portion of the manipulator, the incorporated tools of a manipulator, or a stage, with a high degree of precision. As illustrated in FIG. 1, a piezoelectric position device 36 is incorporated with the manipulator 18 for positioning the tool 24. Similarly, motorized high resolution positioning devices may also accomplish many of these tasks. Positioning devices are commercially offered by a number of vendors and manufacturers. Sources of such positioning devices include Huntington Mechanical Laboratories, Inc., nPoint (1617 Sherman Ave., Madison, Wis. 53704), and Polytec PI, Inc. 16 Albert ST., Auburn, Mass. 01501).

Another accessory that may prove useful is a load cell 38. The load cell 38 may be connected to a manipulator 18 such that the force exerted by a tool 24 on a microsystem device or component part may be monitored and controlled if desired. In this manner the various "pushing" and "pulling" operations that may occur during assembly, disassembly, or testing, of a microsystem device can be monitored to prevent component damage during pressure sensitive operations. Additionally, the presence of such a load cell, in combination with application specific tools, can provide for the measurement of a variety of force-related characteristics of a microsystem device, components, and associated materials of construction. Several suitable load cells are manufactured by Honeywell Sensotec (Honeywell Sensotec, 2080 Arlingate Lane, Columbus Ohio 44107). Some of these cells can measure loads of fractions of a gram. Even higher resolutions are possible by adapting those load cells typically used in high-precision analytical balances.

Other useful accessories may include inductive (eddy current) technology-based detectors. Such detectors may be used, for example, in the determination of the location of tools, microsystem, and the like during assembly or testing. Some of these detectors are capable of resolving positions in the low nanometer range. These types of detectors are commercially available from Kaman Aerospace Corporation (Measuring Systems Group, 217 Smith Street, Middleton, Conn. 06457).

Another useful accessory may be an acoustic emission sensor 40. The acoustic emission sensor 40 is positioned within the operating chamber 14 and detects the sound of contact between a tool and a microsystem device or component, or between two microsystem parts when such parts are being brought together. A potentially suitable acoustic emission sensor is manufactured by Physical Acoustics Corporation (Physical Acoustics Corp., 195 Clarksville Road, Princeton Jct., N.J. 08550) as model µ30. Such a sensor can be mounted to the manipulator or attached to the stage.

Another useful accessory with which the manipulator can be equipped is a buzzer or other audible alarm. These devices are installed such that they sound whenever electrically conductive tool or probe touches an electrically conductive surface. A "contact buzzer" can be helpful in identifying contact when slowly approaching a surface or part. It typically provides an earlier warning of contact than the load cell previously described and is somewhat more reliable than an acoustic emission sensor, also described above, for determining when a surface has been contacted. The use of a variety of redundant systems of this type to provide feedback regarding various situations encountered during an assembly operation may be utilized.

Many conventional scanning electron microscopes incorporate a variety of imaging and/or characterization methods. Such methods can include, but are not limited to, secondary electron imaging, backscatter imaging, specimen current imaging, electron fluorescent imaging, and X-ray microanalysis. These methods provide varied types of information about the sample under observation. In the case of certain embodiments, such samples typically include Microsystems and associated sub-assemblies and/or component parts, although other samples can be viewed and manipulated. For example, secondary electron imaging provides images of the structure of a specimen. Such imaging provides for good observation of surface features. Backscatter imaging can be set to vary contrast with respect to the atomic number of specimen components. By this technique, variations in surface composition are readily observed while surface features are less clearly observed. Specimen current imaging images electrically conductive pathways in the specimen. Electron fluorescent imaging images with respect to the components of the sample that emit light when excited by an electron beam. Finally, x-ray microanalysis (energy dispersive spectroscopy) can provide elemental analysis of virtually any portion of the sample being imaged. Such analysis can be used to provide elemental mapping. Additionally, a light microscope may be incorporated in to the microsystem manipulation apparatus to augment scanning electron microscope imaging, especially at lower magnifications.

Figure 2:
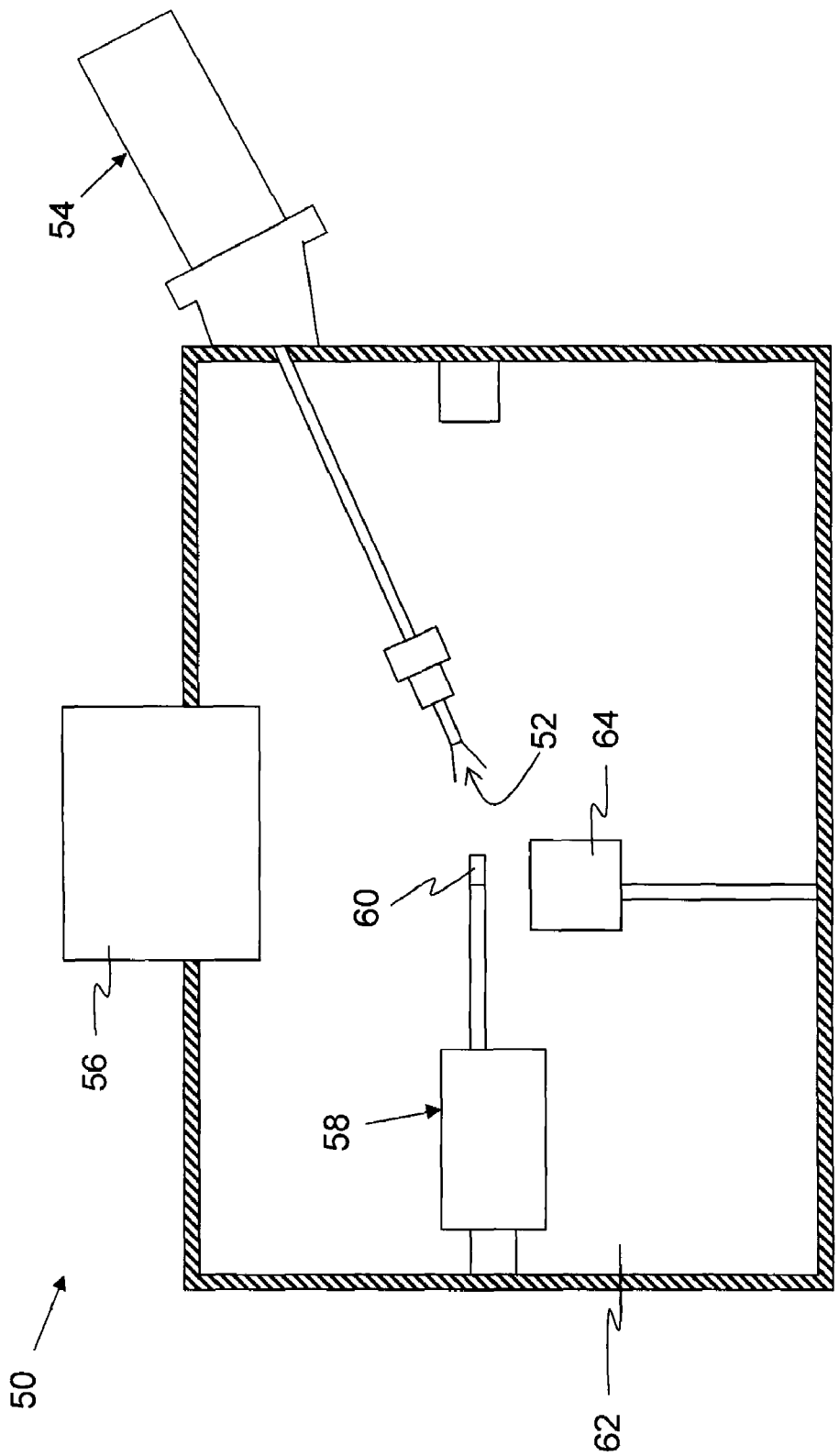
FIG. 2 illustrates a microsystem manipulation apparatus in accordance with another embodiment of the invention.

With reference now to FIG. 2, there is illustrated another embodiment of a microsystem manipulation apparatus 50. The microsystem manipulation apparatus 50 is similar to that described above except that the stage 52 is provided by a tool, in this example, a microgripper, located near an end of a manipulator 54. The manipulator 54 may be used to position the stage within the field of view of the scanning electron microscope 56. A second manipulator 58 having an incorporated tool 60 located within the operating chamber 62 may be provided.

This configuration may be suitable for routine mass assembly and testing. In this configuration, the stage 52 is provided by a manipulator 54 so configured as to hold a microsystem, or component part thereof, by use of tool, in this example, a microgripper, within the field of view of the scanning electron microscope. In operation, the manipulator 54 acquires a microsystem, or component part thereof, from a source of such items, such as a supply reservoir or magazine 64, and holds the microsystem, or component part thereof, while acted upon by the incorporated tool 60 of the second manipulator 58. The manipulator 54 may place the acted-upon microsystem, or component part thereof, in a storage location. The assembly and/or test operation is reinitiated by the manipulator 54 again acquiring a microsystem, or component part thereof, for subsequent action by the tool or probe of the second manipulator 58. All operations may occur within the field of view of the scanning electron microscope. The scanning electron microscope is used to provide for optical guidance of the manipulators through minimally the first cycle of the assembly and/or testing process. Depending on the precision and accuracy of the manipulator motion control, relative to the microsystem, or component part thereof, size and on the degree of automation applied to that control, scanning electron microscope observation of other than the first assembly and/or test cycle may not be necessary.

Another example of a microsystem manipulation apparatus may include a scanning electron microscope, an immovable stage mounted to the operating chamber within the field of view of the scanning electron microscope, and one or more manipulators. In use, a manipulator performs some action upon the microsystem, or component part thereof, located upon the stage. Observation of the desired action is provided by the scanning electron microscope. Based on this observation, manipulator tool control is facilitated.

The microsystem manipulation apparatus can be used to assemble, disassemble, and/or test a vast number of different types of micromachines, microsensors, and/or other microdevices. Such microdevices include, but are not limited to, accelerometers such as those used in airbags, automobile control, pacemakers, games, automotive brakes, image stabilizers and other inertial measurement systems; so-called "laboratory on a chip" type sensors; flow sensors, optical switches, projection and handheld displays; pressure sensors such as those developed for tire pressure and other automotive and industrial applications; miniature read/write heads; cell phone parts; micorsystem devices for radar applications and steerable antennas; microrelays; and a variety of sensors to measure such physical properties as humidity, temperature, vibration, and the like.

Also, the microsystem manipulation apparatus may be used to assemble other devices for microsystem assembly and/or testing. These assembled other devices could be used for mass production and/or testing of microsystem devices or component parts thereof. These other devices would be expected to operate by programmed control without an incorporated scanning electron microscope. Such operation requires that the other, mass production/testing, devices have a high degree of accuracy and precision in all relevant operations. The critical dimensions and tolerances associated with the required accuracy and precision are on the same scale, or lower, than those of the microsystem devices or component parts thereof planned for mass production and/or testing. Assembly of a device to perform the planned mass production and/or testing will require a variety of highly controlled actions and assembly operations. Such highly controlled actions and assembly operations can be readily accomplished by use of a microsystem manipulation apparatus.

In addition to the assembly of various components, through the use of appropriate manipulators, tools, and stage, a microsystem manipulation apparatus is capable of being used to test virtually any physical property of a material or device. Properties that may be tested include, but are not limited to, tensile, creep, fatigue, shear, or compression loading. Among the tests possible is the measurement of properties of virtually any component manufactured in the microsystem scale range. For example, testing of gears, posts, and other structural component or materials is possible. The microsystem manipulation apparatus may be configured with appropriate tools, and stage to measure or test the mechanical properties of materials, coatings, or films with such tests as scratch tests, impact tests and hardness tests. Such testing would not only disclose the information about the strength of such materials, but it would also provide micromechanical information leading to a micromechanical understanding of the mode of failure which is sometimes the most valuable piece of information. For example, utilizing a microhardness indentor for the tool would allow for the measurement of microhardness while optionally observing the sample at the scanning electron microscope resolution. Additionally, the fine control possible with microsystem manipulation apparatus may allow the measurement of both microhardness and nanohardness. Furthermore, all such tests can be done at elevated temperature and all while imaging the test while it is in progress to detect minute changes such as detecting if failure occurs through the formation of a crack at a load point rather than through deformation. Other tests that can be performed include a variety tests such as 3-point and 4-point bend tests, crush tests, and tensile tests. Abrasion testing may also be performed by continually increasing the load placed by an indentor while simultaneously moving the sample beneath the indentor all while the micromechanics of the test are being measured or observed.

The high degree of precision and flexibility in the testing and manipulation of micro-scale materials provided by the microsystem assembly, disassembly, and/or testing device also makes this device useful in non-microsystem related applications. That is, the device can also be used to assemble, disassemble, test, or otherwise manipulate organic and inorganic non-microsystem materials and systems. For example, this device can be used to collect and/or test microsamples contained in or on a larger material or assemblage. The device can also be used to assemble, disassemble and/or otherwise manipulate or prepare inorganic or organic samples, materials, patterns, non-microsystems, and the like on the microscale. Therefore these devices can have utility in a variety of applications. These applications can include, but are not limited to, microsystems associated with biological studies, geological studies, forensic studies, physical science studies, and materials studies.

Figure 3:
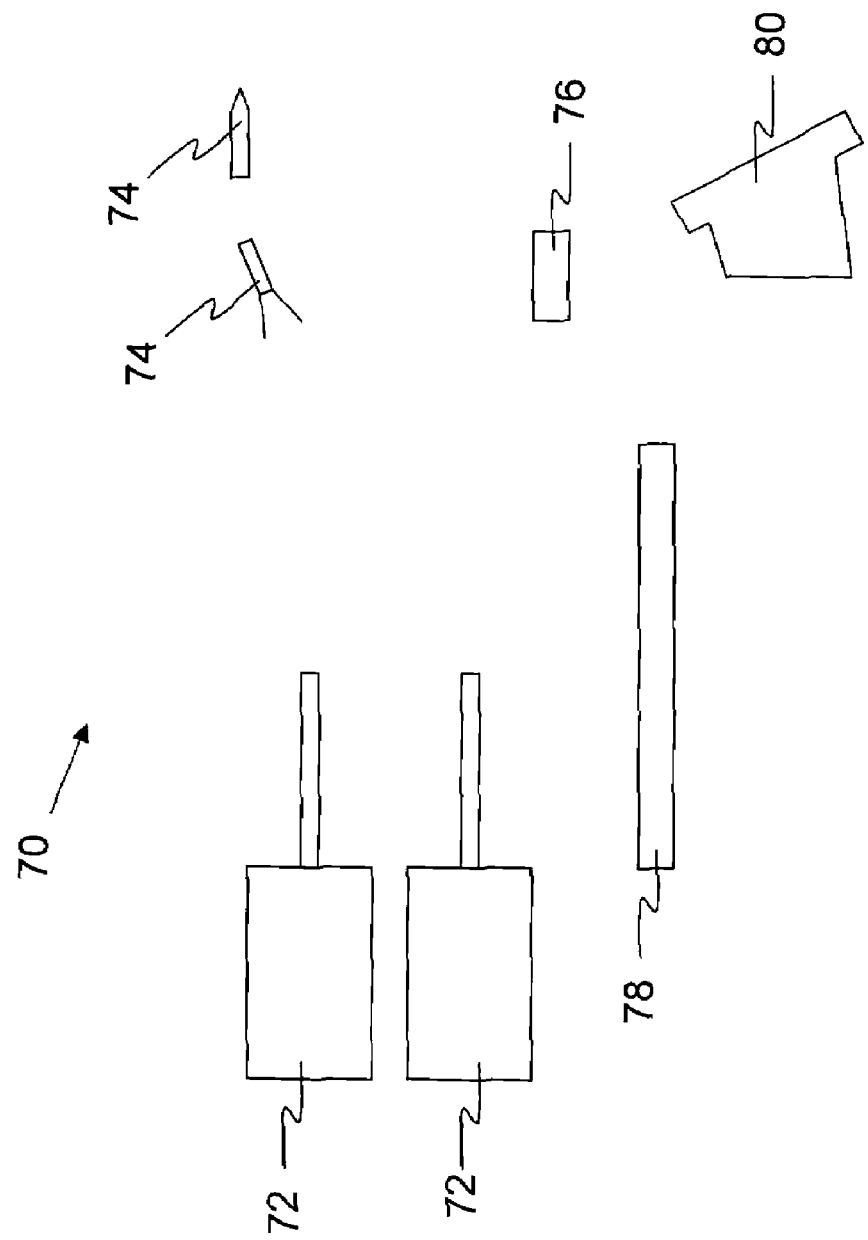
FIG. 3 illustrates a microsystem manipulation kit in accordance with still another embodiment of the invention.

The stage, one or more manipulators, and any tools may be incorporated, along with any related accessories, such as those described above, into a scanning electron microscope instrument during fabrication of that instrument to result in a microsystem manipulation apparatus. Alternatively, a microsystem manipulation apparatus may be produced by equipping an existing scanning electron microscope with the desired number of manipulators and, if required, a stage. An existing scanning electron microscope may also be equipped with other, accessory, devices, such as those described above, as may be desired. As most existing scanning electron microscopes already have a suitable stage and stage manipulator, conversion into a microsystem manipulation apparatus may only require the addition of the desired number of additional manipulators. The incorporation of such additions into the existing scanning electron microscope will then result in a microsystem manipulation apparatus. Almost all scanning electron microscopes and incorporated sample chambers are suitable for conversion to the microsystem manipulation apparatus by the addition of the required manipulator and, as necessary, a stage. Those devices necessary and those accessories desired for such a conversion may be conveniently supplied as a kit. With reference to FIG. 3, there is illustrated a kit 70 in accordance with yet another embodiment of the invention. The kit 70 may include one or more manipulators 72. The manipulator 72 is adapted to be mounted to an operating chamber of a scanning electron microscope. Such adaption may optionally be provided by the inclusion of an alignment guide 80 as part of the kit 70. The manipulator 72 may comprise a linear motion feedthrough device. Alternatively, the manipulator 72 may include a manipulator similar to, or comprising, a scanning electron microscope stage platform. The kit 70 may include at least one tool 74 adapted to be mounted on or incorporated in the manipulator 72. Still further, the kit 70 may also include a device or object 78 having a surface that may be utilized as a stage. The kit 70 may also include one or more accessories 76 such as a load sensor, mounting hardware, operational software, or other items discussed above that may be used with the microsystem manipulation apparatus.

As the invention has been described with respect to certain embodiments, it will be apparent to those skilled in the art that the same may be varied in many ways without departing from the spirit and scope of the invention. Any and all such modifications are intended to be included within the scope of the appended claims.

What is claimed is:

1. A microsystem manipulation apparatus, comprising:
   a scanning electron microscope;
   an operating chamber within which said scanning electron microscope operates;
   a first manipulator having an end within said operating chamber;
   a second manipulator having an end within said operating chamber; and
   a stage movable by a third manipulator and positioned within said operating chamber and near said first manipulator.

2. The microsystem manipulation apparatus of claim 1, wherein said stage is a surface of a scanning electron microscope stage.

3. The microsystem manipulation apparatus of claim 1, wherein said third manipulator comprises a scanning electron microscope stage platform.

4. The microsystem manipulation apparatus of claim 1, wherein said end of said first manipulator comprises a tool.

5. The microsystem manipulation apparatus of claim 4, wherein said tool is selected from the group consisting of a gripper, microgripper, indentor, microindentor, nanoindentor, knife, clamp, scrapper, hook, chisel, punch, heating iron, welding electrode, and adhesive dispenser.

6. The microsystem manipulation apparatus of claim 4, wherein said tool comprises a microgripper.

7. The microsystem manipulation apparatus of claim 1, wherein said first manipulator comprises a piezoelectric positioner near said end of said first manipulator.

8. The microsystem manipulation apparatus of claim 1, further comprising a supply reservoir within said operating chamber positioned within operational reach of said second manipulator.

9. The microsystem manipulation apparatus of claim 1, wherein the sum of the degrees of freedom of the first manipulator, the second manipulator, and the stage is at least two.

10. The microsystem manipulation apparatus of claim 1, wherein the sum of the degrees of freedom of the first manipulator, the second manipulator, and the stage is at least 7.

11. The microsystem manipulation apparatus of claim 1, wherein said first manipulator is located within said operating chamber.

12. The microsystem manipulation apparatus of claim 1, wherein said first manipulator comprises a linear motion feedthrough device.

13. The microsystem manipulation apparatus of claim 1, wherein said first manipulator and said second manipulator each comprise a linear motion feed through device.

14. The microsystem manipulation apparatus of claim 1, wherein said first manipulator further comprises a load cell near said end of said first manipulator.

15. The microsystem manipulation apparatus of claim 1, further comprising an acoustic emissions sensor within said operating chamber.

16. The microsystem manipulation apparatus of claim 1, wherein said operating chamber is a vacuum chamber.

* * * * *